United States Patent
Ishii et al.

(10) Patent No.: US 10,630,912 B2
(45) Date of Patent: Apr. 21, 2020

(54) IMAGE SENSOR, IMAGE CAPTURING APPARATUS, AND METHOD FOR CONTROLLING IMAGE SENSOR

(71) Applicant: CANON KABUSHIKI KAISHA, Tokyo (JP)

(72) Inventors: Mie Ishii, Tokyo (JP); Seiichirou Sakai, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/728,651

(22) Filed: Oct. 10, 2017

(65) Prior Publication Data

US 2018/0109736 A1 Apr. 19, 2018

(30) Foreign Application Priority Data

Oct. 18, 2016 (JP) .................................. 2016-204569

(51) Int. Cl.
  *H04N 5/243* (2006.01)
  *H03M 1/56* (2006.01)
  (Continued)

(52) U.S. Cl.
  CPC .............. *H04N 5/243* (2013.01); *H03M 1/56* (2013.01); *H04N 5/3454* (2013.01);
  (Continued)

(58) Field of Classification Search
  CPC .................................................... H04N 5/243
  (Continued)

(56) References Cited

U.S. PATENT DOCUMENTS

2003/0202111 A1 10/2003 Park
2003/0214597 A1* 11/2003 Nam .................... H04N 5/3575
  348/308
(Continued)

FOREIGN PATENT DOCUMENTS

JP 2005-278135 A 10/2005
JP 2013-009087 A 1/2013
(Continued)

OTHER PUBLICATIONS

The above patent documents were cited in a European Search Report issued on Mar. 16, 2018, of which is enclosed, that issued in the corresponding European Patent Application No. 17190516.9.
The above patent documents were cited in a Japanese Office Action issued on Sep. 10, 2018, of which is enclosed, that issued in the corresponding in Japanese Patent Application No. 2016204569.

*Primary Examiner* — Joel W Fosselman
(74) *Attorney, Agent, or Firm* — Cowan, Liebowitz & Latman, P.C.

(57) ABSTRACT

An image sensor comprising: a pixel portion that outputs a pixel signal; a setting unit that sets a reference voltage in accordance with a shooting condition; a comparator that compares the reference voltage or one of a plurality of comparison voltages having different slopes which change with time and the pixel signal; a selector that selects one of the plurality of comparison voltages according to a result of the comparison between the reference voltage and the pixel signal by the comparator; and a counter that counts a number of clocks until the selected comparison voltage and the pixel signal become equal while the comparator compares the comparison voltage selected by the selector and the pixel signal.

14 Claims, 8 Drawing Sheets

| ISO3200 | | EXPOSURE PERIOD [s] | | | |
|---|---|---|---|---|---|
| | | < 1 sec | ≥ 1 sec, < 8 sec | ≥ 8 sec, < 64 sec | ≥ 64 sec |
| TEMPERATURE AT TIME OF SHOOTING [ °C] | < 0°C | V1 | V1 | V1 | V1 |
| | ≥ 0°C, < 20°C | V1 | V1 | V1 | V1 |
| | ≥ 20°C, < 40°C | V1 | V1 | V1 | V2 |
| | ≥ 40 °C, < 60°C | V1 | V1 | V2 | V2 |
| | ≥ 60°C | V1 | V2 | V2 | V2 |

(51) Int. Cl.
- *H04N 5/378* (2011.01)
- *H04N 5/345* (2011.01)
- *H04N 5/361* (2011.01)
- *H04N 5/3745* (2011.01)
- *H04N 5/376* (2011.01)

(52) U.S. Cl.
CPC ............ *H04N 5/361* (2013.01); *H04N 5/378* (2013.01); *H04N 5/3765* (2013.01); *H04N 5/37455* (2013.01)

(58) Field of Classification Search
USPC ........................................................ 348/294
See application file for complete search history.

(56) References Cited

U.S. PATENT DOCUMENTS

| | | | |
|---|---|---|---|
| 2010/0033362 A1* | 2/2010 | Kitami | H04N 9/04511 |
| | | | 341/169 |
| 2013/0027592 A1 | 1/2013 | Sugiura | |
| 2015/0181146 A1 | 6/2015 | Hashimoto | |
| 2016/0223884 A1* | 8/2016 | Kususaki | G01J 1/4209 |

FOREIGN PATENT DOCUMENTS

| | | |
|---|---|---|
| JP | 2016-134908 A | 7/2016 |
| JP | 2016-144135 A | 8/2016 |

* cited by examiner

FIG. 6

| ISO3200 | EXPOSURE PERIOD [s] | | | | |
|---|---|---|---|---|---|
| | | < 1 sec | ≥ 1 sec, < 8 sec | ≥ 8 sec, < 64 sec | ≥ 64 sec |
| TEMPERATURE AT TIME OF SHOOTING [°C] | < 0°C | V1 | V1 | V1 | V1 |
| | ≥ 0°C, < 20°C | V1 | V1 | V1 | V1 |
| | ≥ 20°C, < 40°C | V1 | V1 | V1 | V2 |
| | ≥ 40°C, < 60°C | V1 | V2 | V2 | V2 |
| | ≥ 60°C | V1 | V2 | V2 | V2 |

F I G. 7
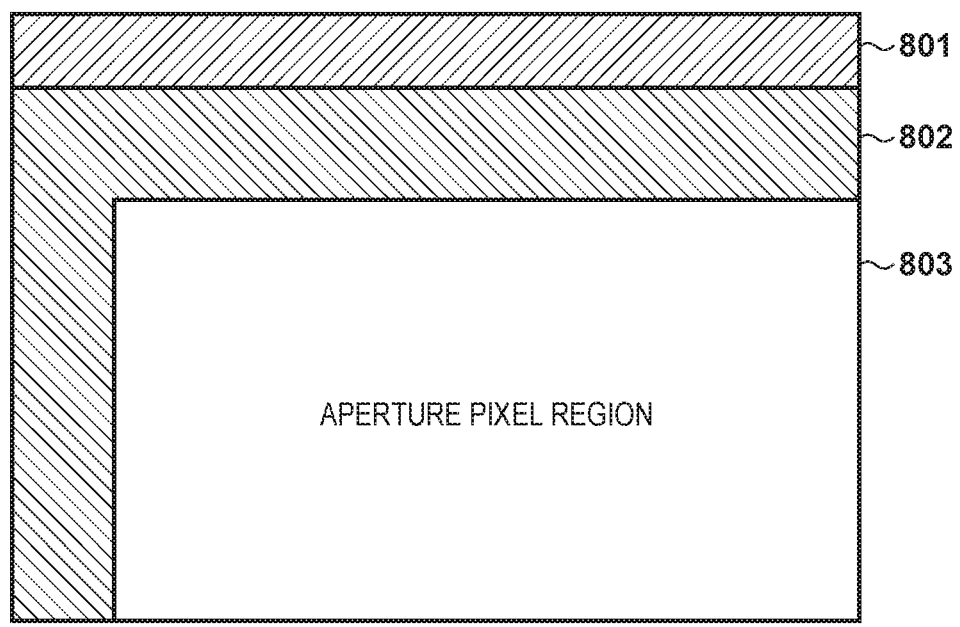

IMAGE SENSOR, IMAGE CAPTURING APPARATUS, AND METHOD FOR CONTROLLING IMAGE SENSOR

BACKGROUND OF THE INVENTION

Field of the Invention

The present invention relates to an image sensor, an image capturing apparatus, and a method for controlling an image sensor.

Description of the Related Art

In recent years, in image capturing apparatuses using image sensor such as CMOS image sensor, advanced functions and multi-functionality are advancing to meet various needs. With respect to CMOS image sensors, there are demands for a method capable of reading pixel signals at a higher speed as the number of pixels and the imaging speed are increased. As a measure for high-speed reading, in recent years, image sensors having analog-to-digital conversion circuits (hereinafter referred to as "ADCs") each of which provided for each column and performs analog-to-digital conversion (hereinafter referred to as "AD conversion"), and outputs a digital signal become popular. By arranging the ADC for each column, it becomes possible to digitally transmit the pixel signal to the outside of the image sensor, enabling high-speed reading.

In Japanese Patent Laid-Open No. 2005-278135, a single slope method is adopted as an AD conversion method in ADC for each column. In the single slope method, a comparator and a counter are used, and an analog pixel signal is input to one input of the comparator while a slope voltage, which is a voltage varying with a slope with time, is input to the other input of the comparator as a reference signal. When the magnitude relationship between the pixel signal and the reference signal is reversed, the output of the comparator is inverted. The counter advances the digital count over time and stops counting progress when the output of the comparator is inverted. In this way, the output of the counter is a digital value corresponding to an analog pixel signal, thereby performing AD conversion.

In the case of a single slope type ADC, in order to realize the high bit resolution of the signal output, the count time by the counter becomes long. For example, in order to improve the resolution of AD conversion from 12 bits to 14 bits, if the operation clock of the counter is constant, it takes four times longer time with 14 bits than with 12 bits as the AD conversion period.

On the other hand, in Japanese Patent Laid-Open No. 2013-9087, a technique capable of reading a pixel signal at a higher speed by switching the resolution of the AD conversion according to the output level (amplitude) of the pixel signal is proposed. When a selection circuit included in the ADC performs AD conversion of a pixel signal having a large amplitude, a slope voltage with a steep slope is selected and AD conversion is performed with a low bit resolution. On the other hand, when performing AD conversion of a pixel signal having a small amplitude, a slope voltage with a gentle slope is selected and AD conversion is performed with a high bit resolution. In this manner, in the single slope method, it is possible to shorten the AD conversion time of a signal with a large amplitude, which takes time to perform AD conversion, although a bit resolution is low.

It is known that a dark current is generated in the image sensor in the case where photographing is performed with long-time exposure, for example. Since the output due to the dark current in the image sensor increases in proportion to the exposure period, the influence thereof cannot be ignored under a long exposure shooting condition. In order to remove the influence of the dark current, a process of subtracting a dark current component from a signal component is performed, however, this process is generally performed after a signal is converted to a digital signal.

In the case where AD conversion is performed with low bit resolution when the amplitude of a signal is large as in Japanese Patent Laid-Open No. 2013-9087, under the photographing condition where the dark current increases, even when the amplitude of the actual light signal is small, the amplitude is increased by the dark current component, which causes a problem that the small amplitude light signal is AD converted with the low bit resolution.

SUMMARY OF THE INVENTION

The present invention has been made in consideration of the above situation, and, even when AD conversion of a slope voltage comparing method is performed under a condition that a dark current increases, obtains an image of high quality.

According to the present invention, provided is an image sensor comprising: a pixel portion that outputs a pixel signal; a setting unit that sets a reference voltage in accordance with a shooting condition; a comparator that compares the reference voltage or one of a plurality of comparison voltages having different slopes which change with time and the pixel signal; a selector that selects one of the plurality of comparison voltages according to a result of the comparison between the reference voltage and the pixel signal by the comparator; and a counter that counts a number of clocks until the selected comparison voltage and the pixel signal become equal while the comparator compares the comparison voltage selected by the selector and the pixel signal.

Further, according to the present invention, provided is an image sensor comprising: a pixel portion that outputs a pixel signal; a setting unit that sets a reference voltage in accordance with an amount of dark current generated in the pixel portion; a comparator that compares the reference voltage or one of a plurality of comparison voltages having different slopes which change with time and the pixel signal; a selector that selects one of the plurality of comparison voltages according to a result of the comparison between the reference voltage and the pixel signal by the comparator; and a counter that counts a number of clocks until the selected comparison voltage and the pixel signal become equal while the comparator compares the comparison voltage selected by the selector and the pixel signal.

Furthermore, according to the present invention, provided is an image capturing apparatus comprising an image sensor that comprises: a pixel portion that outputs a pixel signal; a setting unit that sets a reference voltage in accordance with a shooting condition; a comparator that compares the reference voltage or one of a plurality of comparison voltages having different slopes which change with time and the pixel signal; a selector that selects one of the plurality of comparison voltages according to a result of the comparison between the reference voltage and the pixel signal by the comparator; and a counter that counts a number of clocks until the selected comparison voltage and the pixel signal become equal while the comparator compares the comparison voltage selected by the selector and the pixel signal.

Further, according to the present invention, provided is an image capturing apparatus comprising an image sensor that comprises: a pixel portion that outputs a pixel signal; a setting unit that sets a reference voltage in accordance with an amount of dark current generated in the pixel portion; a comparator that compares the reference voltage or one of a plurality of comparison voltages having different slopes which change with time and the pixel signal; a selector that selects one of the plurality of comparison voltages according to a result of the comparison between the reference voltage and the pixel signal by the comparator; and a counter that counts a number of clocks until the selected comparison voltage and the pixel signal become equal while the comparator compares the comparison voltage selected by the selector and the pixel signal.

Further, according to the present invention, provided is an image capturing apparatus comprising: a pixel portion that outputs a pixel signal; a setting unit that sets a reference voltage in accordance with a shooting condition; a comparator that compares the reference voltage or one of a plurality of comparison voltages having different slopes which change with time and the pixel signal; a selector that selects one of the plurality of comparison voltages according to a result of the comparison between the reference voltage and the pixel signal by the comparator; and a counter that counts a number of clocks until the selected comparison voltage and the pixel signal become equal while the comparator compares the comparison voltage selected by the selector and the pixel signal.

Further, according to the present invention, provided is an image capturing apparatus comprising: a pixel portion that outputs a pixel signal; a setting unit that sets a reference voltage in accordance with an amount of dark current generated in the pixel portion; a comparator that compares the reference voltage or one of a plurality of comparison voltages having different slopes which change with time and the pixel signal; a selector that selects one of the plurality of comparison voltages according to a result of the of comparison between the reference voltage and the pixel signal by the comparator; and a counter that counts a number of clocks until the selected comparison voltage and the pixel signal become equal while the comparator compares the comparison voltage selected by the selector and the pixel signal.

Further, according to the present invention, provided is a method for controlling an image sensor comprising: setting a reference voltage in accordance with a shooting condition; comparing the reference voltage or one of a plurality of comparison voltages having different slopes which change with time and a pixel signal output from a pixel portion; selecting one of the plurality of comparison voltages according to a result of the comparison between the reference voltage and the pixel signal; and comparing the selected comparison voltage and the pixel signal, and counting a number of clocks until the selected comparison voltage and the pixel signal become equal.

Further, according to the present invention, provided is a method for controlling an image sensor comprising: setting a reference voltage in accordance with an amount of dark current generated in a pixel portion; comparing the reference voltage or one of a plurality of comparison voltages having different slopes which change with time and a pixel signal output from the pixel portion; selecting one of the plurality of comparison voltages according to a result of the comparison between the reference voltage and the pixel signal; and comparing the selected comparison voltage and the pixel signal, and counting a number of clocks until the selected comparison voltage and the pixel signal become equal.

Further, according to the present invention, provided is an image sensor comprising: a pixel portion that outputs a pixel signal; a setting unit that sets a reference voltage in accordance with a shooting condition; a comparator that compares the reference voltage and the pixel signal; a selector that selects resolution of AD conversion according to a result of the comparison between the reference voltage and the pixel signal by the comparator; and an AD converter that performs AD conversion on the pixel signal with the resolution selected by the selector.

Further, according to the present invention, provided is an image sensor comprising: a pixel portion that outputs a pixel signal; a setting unit that sets a reference voltage in accordance with an amount of dark current generated in the pixel portion; a comparator that compares the reference voltage and the pixel signal; a selector that selects resolution of AD conversion according to a result of the comparison between the reference voltage and the pixel signal by the comparator; and an AD converter that performs AD conversion on the pixel signal with the resolution selected by the selector.

Further, according to the present invention, provided is an image capturing apparatus comprising: a pixel portion that outputs a pixel signal; a setting unit that sets a reference voltage in accordance with a shooting condition; a comparator that compares the reference voltage and the pixel signal; a selector that selects resolution of AD conversion according to a result of the comparison between the reference voltage and the pixel signal by the comparator; and an AD converter that performs AD conversion on the pixel signal with the resolution selected by the selector.

Further, according to the present invention, provided is an image capturing apparatus comprising: a pixel portion that outputs a pixel signal; a setting unit that sets a reference voltage in accordance with an amount of dark current generated in the pixel portion; a comparator that compares the reference voltage and the pixel signal; a selector that selects resolution of AD conversion according to a result of the comparison between the reference voltage and the pixel signal by the comparator; and an AD converter that performs AD conversion on the pixel signal with the resolution selected by the selector.

Further, according to the present invention, provided is a method for controlling an image sensor comprising: setting a reference voltage in accordance with a shooting condition; comparing the reference voltage and a pixel signal output from a pixel portion; selecting resolution of AD conversion according to a result of the comparison between the reference voltage and the pixel signal; and performing AD conversion on the pixel signal with the selected resolution.

Further, according to the present invention, provided is a method for controlling an image sensor comprising: setting a reference voltage in accordance with an amount of dark current generated in a pixel portion; comparing the reference voltage and a pixel signal output from the pixel portion; selecting resolution of AD conversion according to a result of the comparison between the reference voltage and the pixel signal; and performing AD conversion on the pixel signal with the selected resolution.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 6 is a diagram showing an example of setting conditions of a reference voltage VREF according to the first embodiment;

FIG. 7 is a diagram showing a configuration example of a pixel portion of an image sensor according to a second embodiment.

DESCRIPTION OF THE EMBODIMENTS

Exemplary embodiments of the present invention will be described in detail in accordance with the accompanying drawings.

First Embodiment

Figure 1:
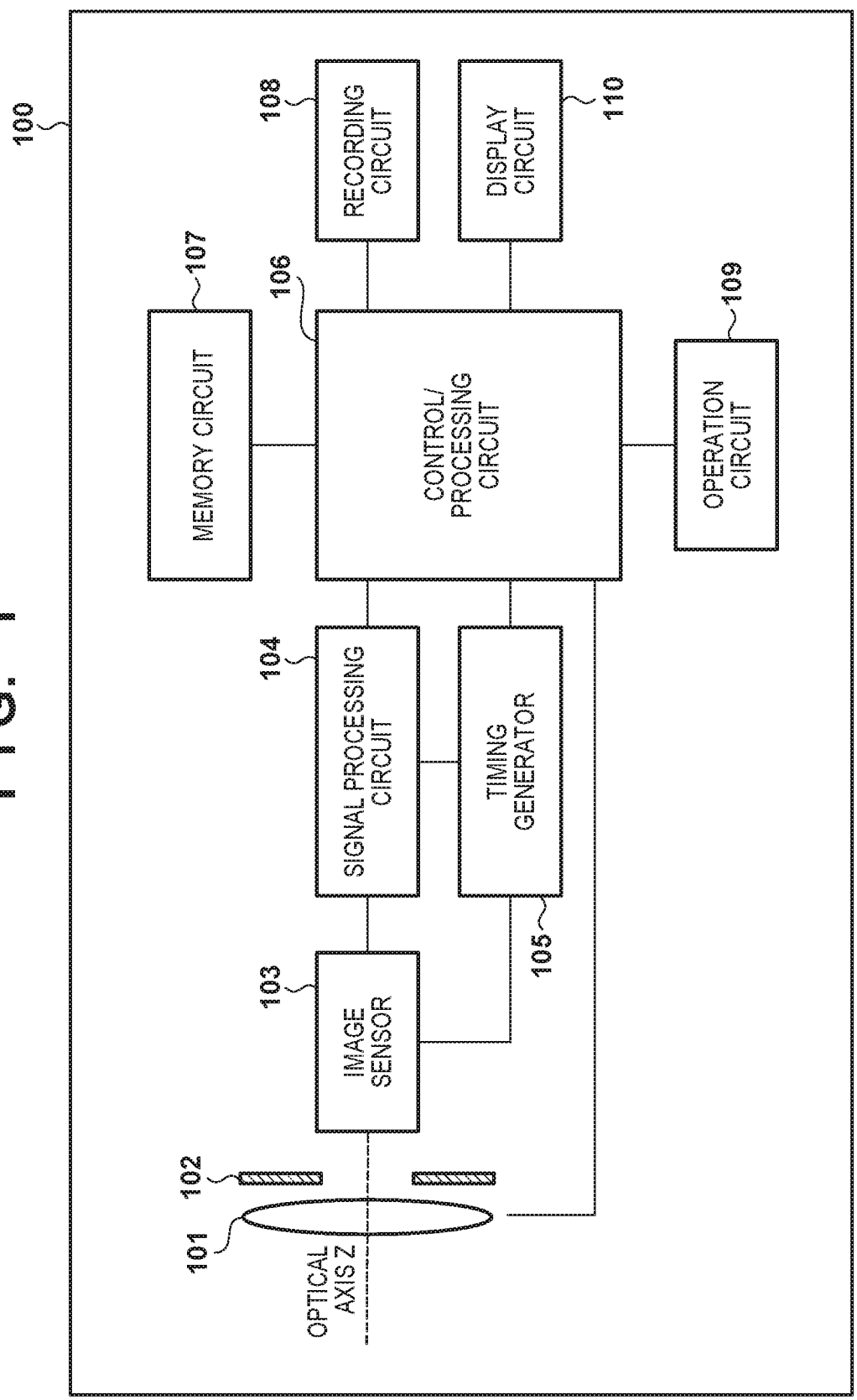
FIG. 1 is a block diagram illustrating an overall configuration of an image capturing apparatus according to an embodiment of the present invention.

FIG. 1 is a block diagram illustrating an overall configuration of an image capturing apparatus 100 according to an embodiment of the present invention. In FIG. 1, light passing through an imaging lens 101 and a diaphragm 102 forms an image in the vicinity of the focal position of the imaging lens 101. Although the imaging lens 101 is shown as a single lens, actually it is composed of a group of a plurality of lenses. An image sensor 103 is, for example, a CMOS image sensor, and has a function of converting a subject image formed by the imaging lens 101 into an electric signal in accordance with the light amount and converting the electrical signal into an image signal that can be subjected to data processing. A signal processing circuit 104 performs various corrections such as signal amplification, reference level adjustment, data rearrangement, and the like on the image signal output from the image sensor 103. A timing generator 105 outputs drive timing signals to the image sensor 103, the signal processing circuit 104, and so on.

A control/processing circuit 106 performs overall drive and control of the entire image capturing apparatus 100 including the image sensor 103, the signal processing circuit 104, and the like. The control/processing circuit 106 also performs predetermined image processing, defect correction and so forth on the image signal output from the signal processing circuit 104. A memory circuit 107 and a recording circuit 108 are recording media such as a nonvolatile memory or a memory card for recording and holding image signals and the like outputted from the control/processing circuit 106. An operation circuit 109 receives a signal from an operation member provided in the image capturing apparatus 100, and reflects the user's instruction to the control/processing circuit 106. A display circuit 110 displays images after shooting, live view images, various setting screens, and so forth.

Figure 2:
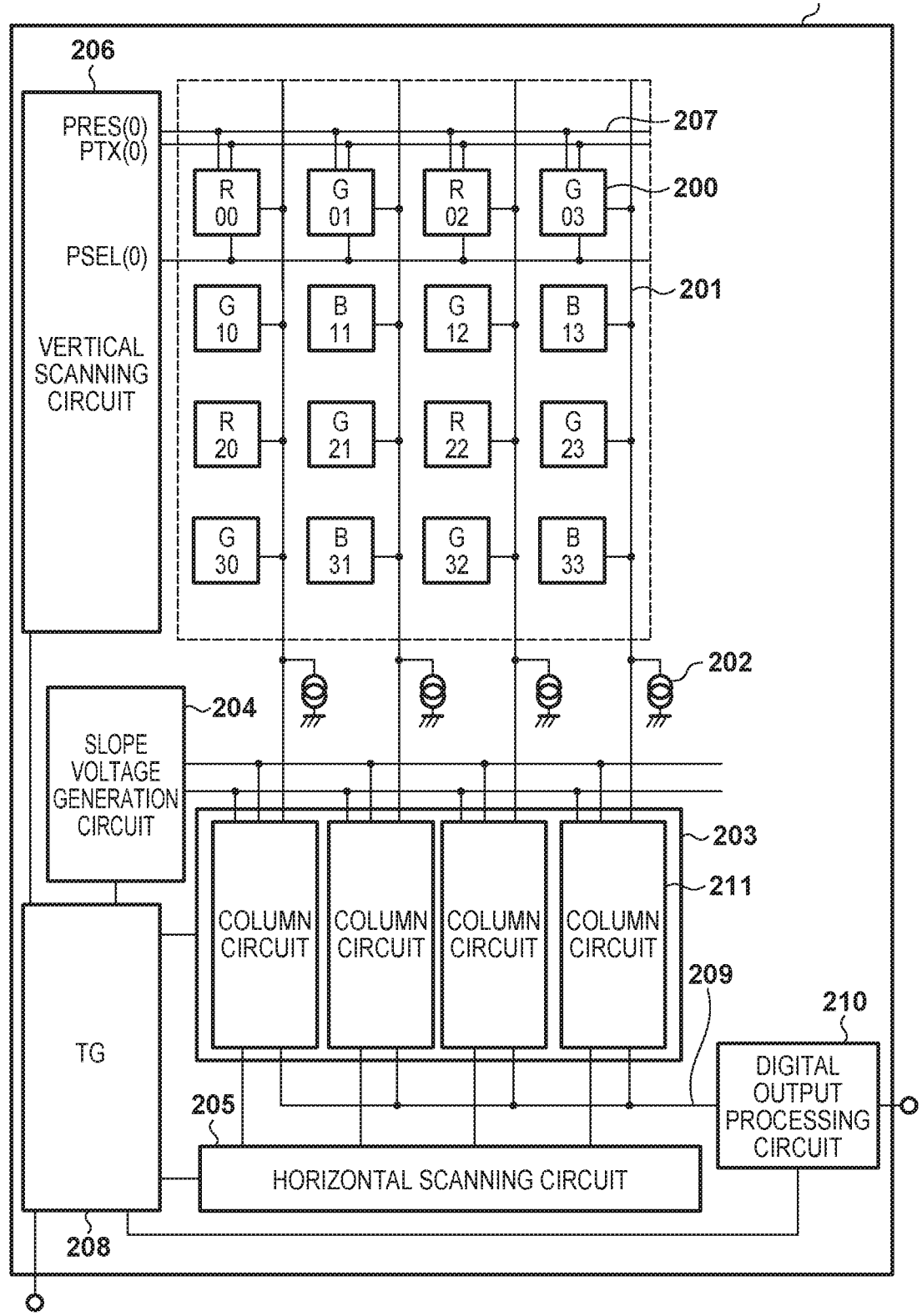
FIG. 2 is a block diagram illustrating a configuration of an image sensor according to the embodiment.

Next, the configuration of the image sensor 103 will be described with reference to FIGS. 2 and 3. FIG. 2 is a block diagram showing an example of a configuration of the image sensor 103 according to the embodiment.

In the image sensor 103, a plurality of unit pixels 200 are arranged in a matrix. In FIG. 2, the case where a total of 16 unit pixels 200 are arranged in 4 rows and 4 columns is illustrated, but tens of millions of unit pixels 200 are actually arranged. The unit pixels 200 are provided with color filters of Bayer arrangement of red (R), green (G), and blue (B). In FIG. 2, the letters and numbers written in each of the unit pixels 200 indicate the color and address of the pixel. For example, G01 indicates a G (green) pixel in the 0th (uppermost) row and the 1st column. Each unit pixel 200 outputs a pixel signal obtained by photoelectric conversion corresponding to the amount of incident light to a column output line 201. A current source 202 is connected to each column output line 201.

A readout circuit portion 203 includes a plurality of column circuits 211, and pixel signals on the column output lines 201 are input to the column circuits 211, respectively, and performs analog-to-digital (A/D) conversion. A slope voltage generation circuit 204 generates a slope voltage to be used for AD conversion performed by the column circuits 211. Note that the slope voltage varies in potential with a constant rate of change with respect to time, and the slope voltage generation circuit 204 can simultaneously generate a plurality of patterns of slope voltages having different slopes. Further, the slope voltage generation circuit 204 also generates a reference voltage VREF. The signals A/D-converted by the column circuits 211 are sequentially output to the outside of the image sensor 103 via a horizontal output line 209 and a digital output processing circuit 210 under the driving of a horizontal scanning circuit 205. A vertical scanning circuit 206 selects a pixel row to be driven and drives a selected pixel row via a signal line 207 provided for each row. It should be noted that, in FIG. 2, the signal line 207 is shown only for the 0th row, but is actually provided for each row.

The vertical scanning circuit 206, the slope voltage generation circuit 204, the readout circuit portion 203, the horizontal scanning circuit 205, and the digital output processing circuit 210 operate in accordance with timing signals from a timing generator (TG) 208, respectively. Further, the TG 208 operates in accordance with the timing signal from the timing generator 105 in FIG. 1.

Figure 3:
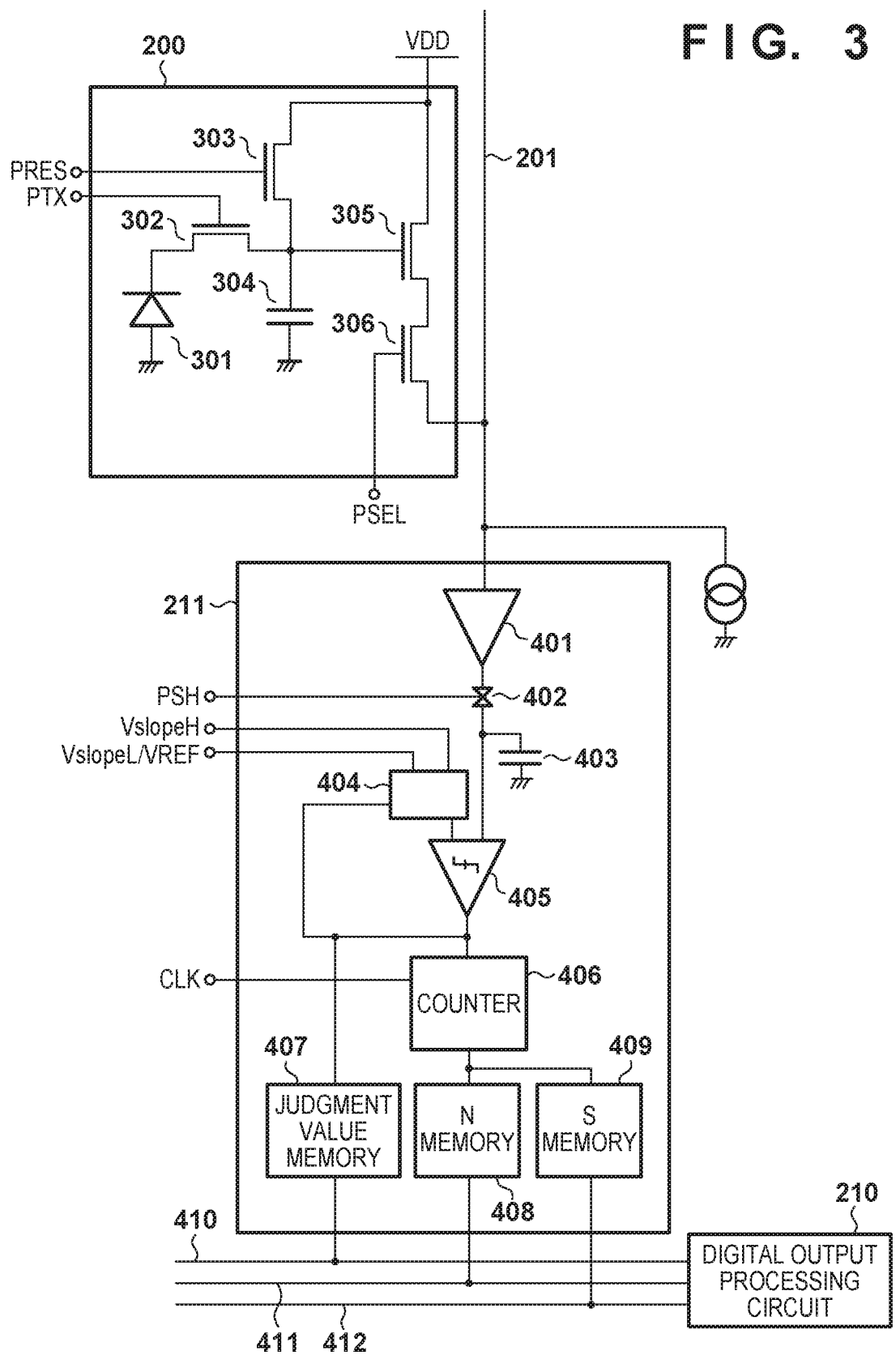
FIG. 3 is a diagram showing an example of a circuit configuration of a unit pixel and a column circuit of the image sensor according to the embodiment.

FIG. 3 is a diagram showing an example of a circuit configuration of the unit pixel 200 and the column circuit 211 of the image sensor 103 according to the embodiment. In the unit pixel 200, a photodiode (PD) 301, which is a photoelectric conversion unit, receives an optical image formed by the imaging lens 101, generates electric charge, and accumulates the generated electric charge. The charge accumulated in the PD 301 is transferred to a floating diffusion portion (FD) 304 via a transfer MOS transistor (transfer switch) 302. When a selection switch 306 is turned on, the electric charge transferred to the FD 304 is output to the column output line 201 as a voltage corresponding to the electric charge via an amplification MOS transistor (SF) 305 forming the source follower amplifier. The selection switch 306 is controlled in units of rows, and the pixel signals of the selected row are simultaneously outputted to the column output lines 201 of respective columns. A reset MOS transistor (reset switch) 303 resets the potential of the FD 304 and the potential of the PD 301 to VDD via the transfer switch 302. The transfer switch 302, the reset switch 303, and the selection switch 306 are controlled by control signals PTX, PRES, and PSEL, respectively, via the signal line 207 connected to the vertical scanning circuit 206.

Next, the column circuit 211 constituting the readout circuit portion 203 will be described. As described above, the readout circuit portion 203 includes a plurality of column circuits 211, and a signal output from the column output line 201 is input to the column circuit 211. An amplifier 401 amplifies the signal output to the column output line 201, and the capacitor 403 is used to hold the signal voltage. Writing to the capacitor 403 is controlled by a switch 402 that is turned on/off by a control signal PSH. To one of inputs of a comparator 405, a reference signal VREF or a slope voltage VslopeH or VslopeL, as a comparison voltage, supplied from the slope voltage generation circuit 204 shown in FIG. 2 is selectively inputted via a selection circuit 404. Details of the operation of the selection circuit 404 will be described later. The output signal voltage of the amplifier 401 written in the capacitor 403 is input to the other input of the comparator 405. The comparator 405 compares the output signal voltage of the amplifier 401 with the reference voltage VREF or the slope voltage VslopeH or VslopeL which is the comparison voltage, and outputs one of two values, low level and high level, depending on the magnitude relation. Specifically, the comparator 405 outputs a low level when the voltage input from the selection circuit 404 is smaller than the output signal voltage of the amplifier 401, and outputs a high level when the voltage input from the selection circuit 404 is greater than the output signal voltage of the amplifier 401. A clock CLK starts at the same time as the transition of slope voltage VslopeH or VslopeL which is the comparison voltage starts. Then, a counter 406 counts up in response to the clock CLK while the output of the comparator 405 is at the high level, and stops to count at the same time as the output of the comparator 405 is inverted to the low level (the magnitude relationship is reversed).

The result of comparing the reference voltage VREF and the output signal from the amplifier 401 in the comparator 405 is held in a judgment value memory 407. In an N memory 408, a digital signal obtained by AD conversion of an analog signal of a reset release level of the FD 304 (hereinafter referred to as "N signal") is held, for example. In an S memory 409, a digital signal obtained by AD conversion of an analog signal obtained by superimposing a signal of the PD 301 on the N signal of the FD 304 (hereinafter referred to as "S signal") is held. Details on the signals held in the judgment value memory 407, N memory 408, and S memory 409 will be described later.

The signals held in the judgment value memory 407, the N memory 408, and the S memory 409 are output to the digital output processing circuit 210 via horizontal output lines 410, 411, and 412 under the control of a control signal from the horizontal scanning circuit 205. Then, in the digital output processing circuit 210, the N signal is subtracted from the S signal, and a signal from which the reset noise component of the FD 304 which is a main cause of noise is removed is output. The processing of the digital output processing circuit 210 will be described later.

Figure 4:
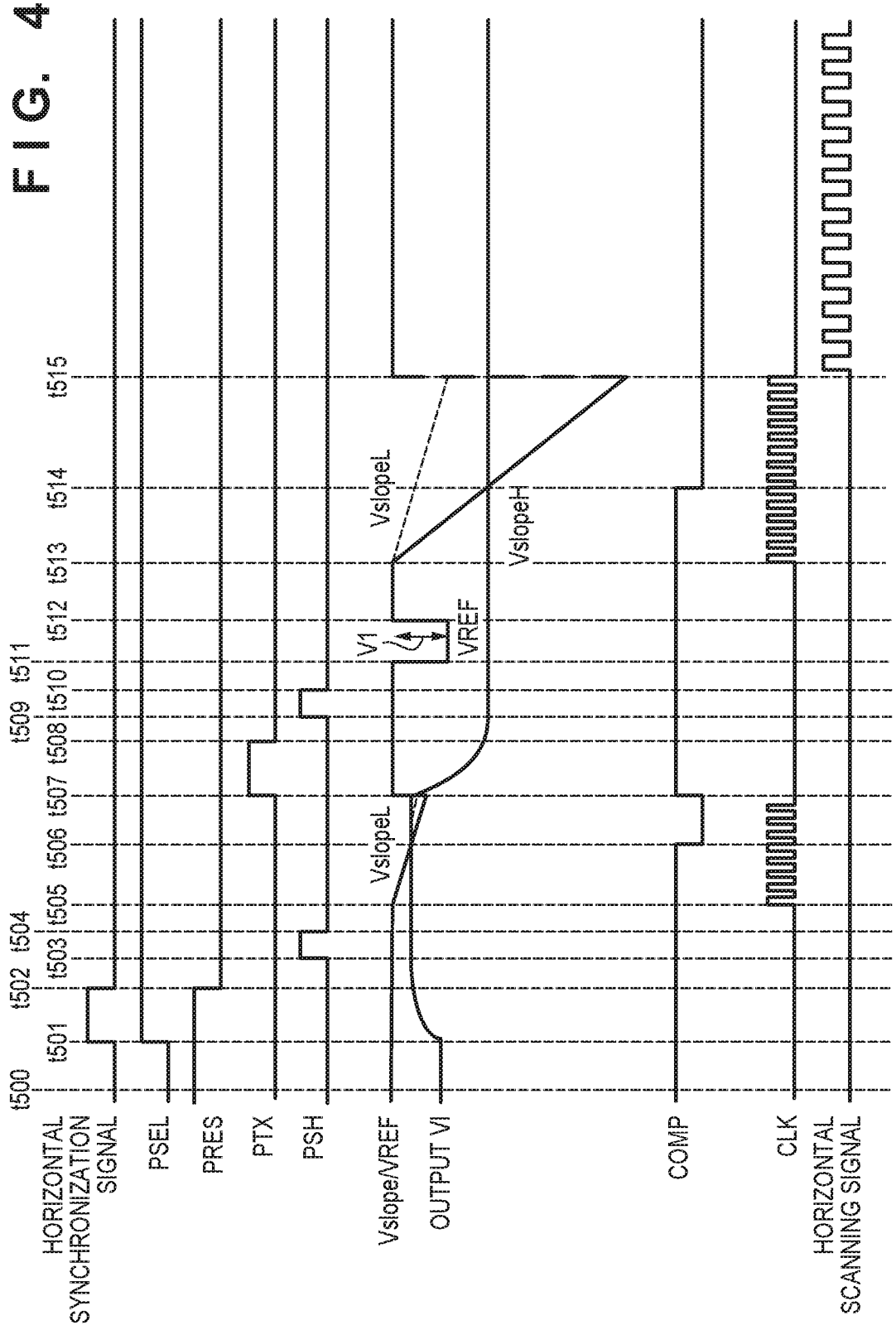
FIG. 4 is a timing chart showing an example of a signal readout operation at the time of normal shooting of the image sensor according to a first embodiment.

Next, the signal read operation from the unit pixels 200 for one row of the image sensor 103 having the circuit configuration shown in FIG. 3 will be described with reference to a timing chart shown in FIG. 4. Note that the image sensor 103 in this embodiment has a mode of performing AD conversion by selecting one of a plurality of types of slope voltages in accordance with the output level of a signal and using the selected slope voltage. FIG. 4 schematically shows the timing of each drive pulse, the slope voltage VslopeH or VslopeL, the reference voltage VREF, the clock CLK, and a horizontal scan pulse signal. In addition, a potential V1 output from the amplifier 401 at each timing is also shown. A comparison output COMP indicates the output level of the comparator 405.

Prior to the reading of the signal from the PD 301, the control signal PRES of the reset switch 303 becomes Hi (time t500). As a result, the gate of the SF 305 and the FD 304 are reset to the reset power supply voltage. At time t501, the control signal PSEL is set to Hi and the SF 305 is set to the operating state. Then, at time t502, the control signal PRES is set to Lo to release the reset of the FD 304. The potential of the FD 304 at this time is read out as an analog signal (N signal) of the reset release level to the column output line 201 and input to the column circuit 211 constituting the readout circuit portion 203. At the times t503 and t504, by sequentially setting the control signal PSH to Hi and Lo to turn the switch 402 on then off, the N signal output to the column output line 201 is amplified with a desired gain at the amplifier 401 and then held at the capacitor 403. The potential of the N signal held in the capacitor 403 is input to one of the inputs of the comparator 405.

After the switch 402 is turned off at the time t504, from the time t505 to the time t507, the slope voltage Vslope L is decreased from the initial value with the time by the slope voltage generation circuit 204. Note that the slope voltage generation circuit 204 can simultaneously generate a plurality of slope voltages having different slopes, that is, a slope voltage VslopeH having a steep slope and a slope voltage VslopeL having a gentle slope, and input them to the column circuit 211. However, only the slope voltage VslopeL is generated here and input to the comparator 405 via the selection circuit 404 of the column circuit 211. By using the slope voltage VslopeL as the comparison voltage, it is possible to perform AD conversion with higher resolution than when using the slope voltage VslopeH for the same signal amplitude. These operations are realized by sending control signals from the TG 208 to the slope voltage generation circuit 204 and the selection circuit 404 of the column circuit 211.

At the same time as the transition of the slope voltage Vslope L starts at time t505, the clock CLK is supplied to the counter 406. The value of the counter 406 increases in accordance with the number of clocks CLK. When the slope voltage VslopeL input to the comparator 405 reaches the same level as the N signal (time t506), the comparison output COMP of the comparator 405 becomes low level, and the operation of the counter 406 is also stopped at the same time. The count value when the operation of the counter 406 is stopped is the AD converted value of the N signal and is held in N memory 408.

Next, at time t507 and t508 after holding the digitized N signal in N memory 408, the control signal PTX is sequentially set to Hi and Lo, and the photo charge accumulated in the PD 301 is transferred to the FD 304. Then, the potential fluctuation of the FD 304 corresponding to the charge amount is outputted as the S signal (light component+reset noise component (N signal)) to the column output line 201 and input to the column circuit 211. After the S signal is amplified with a desired gain by the amplifier 401, at the time t509 and t510, the control signal PSH is sequentially set to Hi and Lo to turn on and off the switch 402, thereby the S signal is held in the capacitor 403. The potential of the S signal held in the capacitor 403 is input to one of the inputs of the comparator 405. After the switch 402 is turned off at the time t510, the reference voltage VREF is input to the other input of the comparator 405 during the period from the time t511 to the time t512. The reference voltage VREF is generated by the slope voltage generation circuit 204 and input to the comparator 405 via the selection circuit 404 of the column circuit 211.

Subsequently, from the time t513 to the time t515, the slope voltage generation circuit 204 decreases the slope voltage VslopeL or VslopeH from the initial value along with the time. Which of the slope voltages VslopeH and VslopeL each column circuit 211 inputs to the comparator 405 is determined according to the value (comparison result) of the comparison output COMP of the comparator 405 between the times t511 and t512.

In the example shown in FIG. 4, when the level of the output voltage V1 is compared with the level of the reference voltage VREF (reference value), since the output voltage V1 is less than the reference voltage VREF (V1), the comparison output COMP is high level (=1). The comparison output COMP level is also input to the selection circuit 404. When the comparison output COMP=1, the slope voltage VslopeH having a relatively steep inclination is selected and input to the comparator 405. On the other hand, when the output voltage V1≥the reference voltage VREF, the comparison output COMP=0, and the slope voltage VslopeL having a relatively gentle slope inclination is selected. Here, the value of the comparison output COMP from the time t511 to the time t512 is set as the judgment value J, and inputted to the selection circuit 404, and also held in the judgment value memory 407. Though not shown in FIG. 3, a switch may be provided so that the output of the comparator 405 is input to the selection circuit 404 and the judgment value memory 407 only during the period from the time t511 to the time t512.

At the same time as the transition of the slope voltage VslopeH starts, the clock CLK is supplied to the counter 406. The value of the counter 406 increases in accordance with the number of clocks CLK. When the slope voltage VslopeH input to the comparator 405 reaches the same level as the S signal, the comparison output COMP of the comparator 405 becomes low level (time t514), and the operation of the counter 406 also stops at the same time. The count value when the operation of the counter 406 is stopped is the AD conversion value of the S signal and is held in the S memory 409 which is a memory for the S signal.

Subsequently, the signals held in the judgment value memory 407, N memory 408, and S memory 409 are read by the horizontal scanning circuit 205. By sequentially operating the column circuits 211 from the time t515, the signals held in the judgment value memory 407, N memory 408, and S memory 409 are sent to the digital output processing circuit 210 via the horizontal output lines 410, 411, and 412. Then, after the signals undergo operation processing in the digital output processing circuit 210, the signals are output to the outside of the image sensor 103.

In the digital output processing circuit 210, the differential signal level (light component) obtained by subtracting the N signal from the S signal is calculated, and in this embodiment, before the S signal–N signal calculation, the AD conversion result is corrected in accordance with the selected slope voltage at the time of AD conversion of the S signal.

Here, the correction processing of the AD conversion result will be described. For example, when the inclination of the slope voltage VslopeH is four times as steep as the inclination of the slope voltage VslopeL, the signal amplitude corresponding to one count of the clock CLK when performing AD conversion using the slope voltage VslopeH is four times as large as the signal amplitude using the slope voltage VslopeL. Accordingly, in order to match the digital outputs corresponding to a potential level of a signal, a process of amplifying the count value AD-converted by the slope voltage VslopeH by 4 times with a digital gain is performed. Whether correction processing is necessary for the S signal input to the digital output processing circuit 210 can be judged on the basis of the judgment value J held in the judgment value memory 407. More specifically, if the judgment value J=1, since the slope voltage VslopeH was selected, processing for amplifying the S signal by a factor of 4 is performed, and if the judgment value J=0, since the slope voltage VslopeL was selected, the processing for amplifying the S signal is not performed.

Although the level of the reference voltage VREF for determining the judgment value J may be arbitrarily set. For example, when the inclination of the slope voltage VslopeH is four times the inclination of the slope voltage VslopeL, the level of the reference voltage VREF may be set to a value that is a quarter of the maximum amplitude of an output signal to be A/D converted. For example, when the maximum amplitude of an output signal to be A/D converted is 1 [V], the reference voltage VREF is set to be equivalent to the amplitude of 0.25 [V]. In a configuration that counts up to 4095 in 12 bits at the time of AD conversion, the slope voltage VslopeL is controlled so that the amplitude becomes 0.25 [V] at the count 4095. Then, the slope voltage VslopeH is controlled so that the amplitude becomes 1 [V] at the count 4095. In the case of performing the AD conversion with such a configuration, results of the correction processing for output values of low luminance, namely, for outputs with a small amplitude of 0.25 [V] or less, are obtained in increments of one count from 0 to 4095. Further, results of the correction processing for output values of high luminance, namely, for outputs with a large amplitude greater than 0.25 [V] and equal to or less than 1 [V], are obtained in four count increment from 4096 to 16380. In this way, although the resolution of the high luminance output becomes coarser than that of the low luminance output, AD conversion can be performed at high speed without taking time to count corresponding to 14 bits.

By the way, it is known that the influence of the dark current generated in the image pickup device becomes large in the case of performing the long-time exposure or the case of shooting under high temperature. Since the amount of dark current on the signal is proportional to the exposure period, its influence cannot be ignored under shooting conditions that require the long-time exposure. In addition, the dark current has high temperature dependency, and when the temperature increases by 8 to 10° C., the dark current amount is substantially doubled. If the AD conversion is performed by the driving method described in FIG. 4 under the condition that the dark current is large, even if an actual light signal has a small amplitude, the amplitude increases due to the dark current, and the AD conversion is performed using the slope voltage VslopeH, which leads to a coarse bit resolution, and as a result, image quality is deteriorated.

Accordingly, in the present embodiment, the value of the reference voltage VREF is changed according to the set shooting condition. Specifically, under the photographing condition in which the dark current increases, the amplitude of the reference voltage VREF is increased, and the range where the AD conversion is performed using the slope voltage VslopeL having a relatively small slope is widened.

Figure 5:
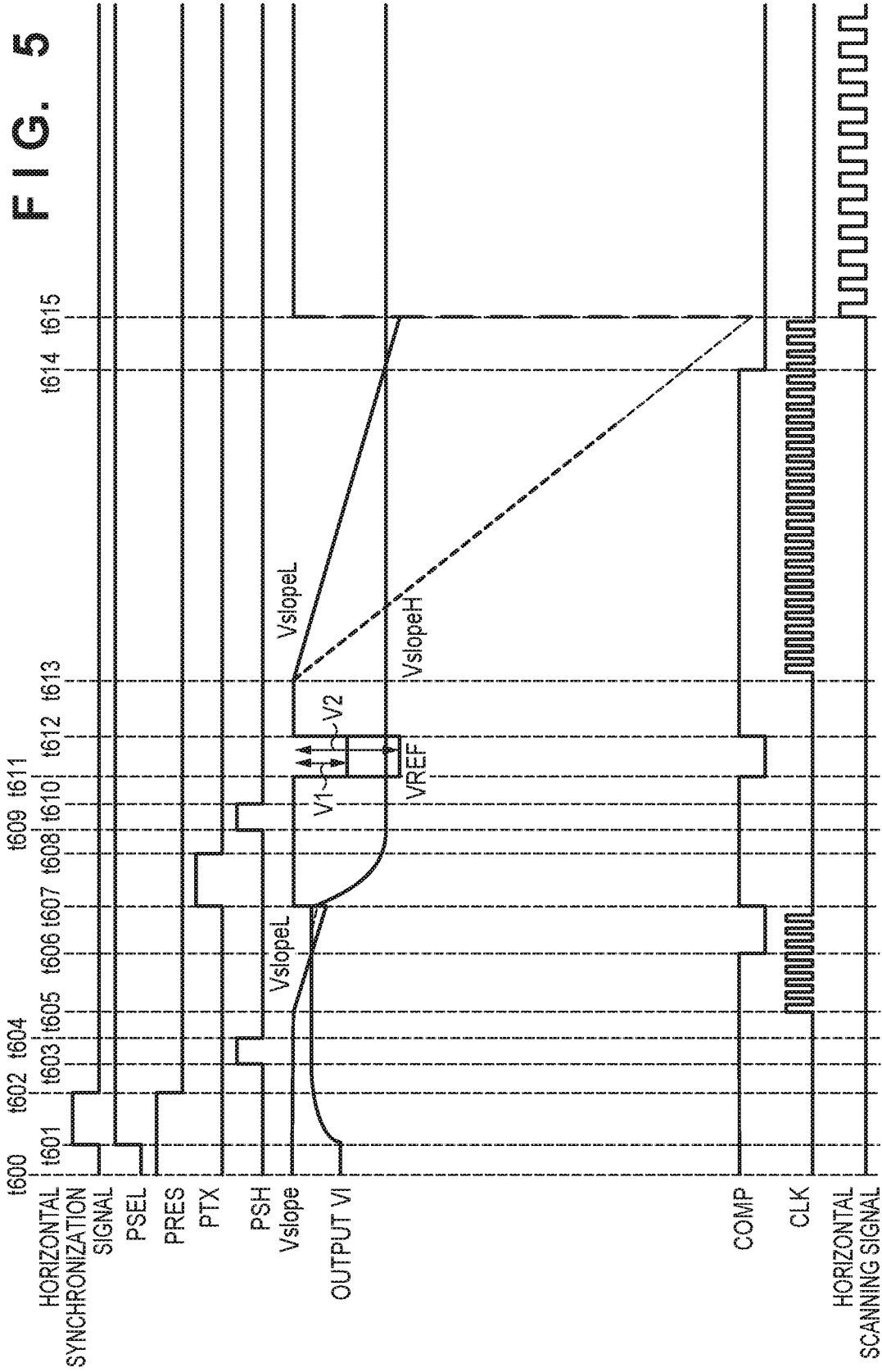
FIG. 5 is a timing chart showing an example of a signal readout operation of an image sensor under long-time exposure and high-temperature shooting conditions according to the first embodiment.

FIG. 5 is a timing chart showing an example of a signal readout operation under long-time exposure and high-temperature shooting conditions. The operation from the time t600 to the time t610 is the same as the operation from the time t500 to the time t510 during the normal shooting shown in FIG. 4, and the description thereof will be omitted.

After the switch 402 is turned off at the time t610, the reference voltage VREF is input to the other input of the comparator 405 during the period from the time t611 to the time t612. The reference voltage VREF is generated by the slope voltage generation circuit 204 and input to the comparator 405 via the selection circuit 404 of the column circuit 211. Here, the reference voltage VREF gives V2 having a large amplitude with respect to V1 at the time of normal shooting shown in FIG. 4.

Subsequently, from the time t613 to the time t615, the slope voltage generation circuit 204 decreases the slope voltage VslopeL or VslopeH from the initial value along with the time. Which of the slope voltages VslopeH and VslopeL each column circuit 211 inputs to the comparator 405 is decided according to the value of the comparison output COMP of the comparator 405 from the time t611 to the time t612.

In the example shown in FIG. 5, when the level of the output voltage V1 is compared with the level of the reference voltage VREF (reference value), since the output voltage V1 is equal to or greater than the reference voltage VREF (V2), the comparison output COMP becomes low level (=0). Therefore, the slope voltage VslopeL having a relatively gentle inclination is selected. Here, the value of the comparison output COMP from the time t611 to the time t612 is entered into the selection circuit 404 as a judgment value J and is also held in the judgment value memory 407.

At the same time as the transition of the slope voltage VslopeL starts, the clock CLK is supplied to the counter 406. The value of the counter 406 increases in accordance with the number of clocks CLK. When the slope voltage VslopeL input to the comparator 405 reaches the same level as the S signal, the comparison output COMP of the comparator 405 becomes low level (time t614), and the operation of the counter 406 also stops at the same time. The count value when the operation of the counter 406 is stopped is the AD conversion value of the S signal and is held in the S memory 409 which is a memory for the S signal.

Subsequently, the signals held in the judgment value memory 407, N memory 408, and S memory 409 are read by the horizontal scanning circuit 205. By sequentially operating the column circuits 211 from the time t615, the signals held in the judgment value memory 407, N memory 408, and S memory 409 are sent to the digital output processing circuit 210 via the horizontal output lines 410, 411, and 412. Then, after the signals undergo operation processing in the digital output processing circuit 210, the signals are output to the outside of the image sensor 103.

It should be noted that the slope voltage VslopeL needs to be changed to the same potential as the reference voltage VREF. In this drive, the reference voltage VREF is V2, and the amplitude voltage is larger than V1. Therefore, the time t615 is later than the time t515 shown in FIG. 4 at which the slope voltage VslopeL changes to V1. The count value counted by the counter 406 is also larger than when the reference voltage VREF is V1. For example, when V2 is twice V1, the count value also doubles. Here, since the time t615 is greater than the time t515, in a case where the slope voltage VslopeH is selected due to the output voltage V1<the reference voltage VREF (V2), it is possible to perform the AD conversion to a potential with a larger amplitude than when driving is made as shown in FIG. 4. In this manner, if the range in which the AD conversion can be performed is increased, the output value of the light signal component can be obtained even under the shooting condition in which the dark current increases. In this case, it is necessary to make the memory width (bits) for the AD conversion result larger than the memory width (bits) for a signal to be output to the outside of the image sensor 103.

Consider, for example, a case where an output of 1 [V] is 16380 corresponding to 14 bits as in the example described above. When the reference voltage VREF is set to V2=0.50 [V] with respect to V1=0.25 [V], and the slope voltage VslopeL controlled so as to have an amplitude of 0.25 [V] at 4095 counts is used, a count value up to V2 becomes 8191. Then, when the inclination of the slope voltage VslopeH is four times the inclination of the slope voltage VslopeL, it is possible to perform AD conversion up to the output voltage 2 [V] when counting up to 8195, and the corrected count value becomes 32764. If the dark current component is equivalent to 0.50 [V], and if the AD conversion can only be performed up to 1 [V], the range of the AD conversion is compressed by the dark current component, and only 0.50 [V] of the light signal component can be obtained. On the other hand, if AD conversion is possible up to 2 [V], a sufficient amount of the light signal component can also be AD converted. If the dark current component is subtracted in the digital output processing circuit 210 and processed so as to match the memory width for a signal to be output to the outside of the image sensor 103 and then outputted, the signal output from the image sensor 103 becomes a value that is not affected by a dark current and has a sufficient dynamic range of the light signal.

Although the signal readout operation shown in FIG. 5 takes longer time than the signal readout operation shown in FIG. 4, the need for reading at a high frame rate is small in the photographing conditions such as long time exposure, the signal readout operation shown in FIG. 5 is preferable.

Subsequently, a specific example of changing the value of the reference voltage VREF according to the shooting condition to be set will be described. As described above, since there is no need to read out at a high frame rate in a long time exposure, the reference voltage VREF=V1 may be set for short-time exposure and the reference voltage VREF=V2 may be set for long-time exposure. Further, the reference voltage may be switched according to the dark current amount. Since the amount of dark current generated by the image sensor 103 can be estimated in advance, a table showing setting conditions of the reference voltage VREF may be stored in the image sensor or the image capturing apparatus, and may be switched according to the shooting conditions.

FIG. 6 is an example of a table showing setting conditions of the reference voltage VREF. FIG. 6 shows the conditions in ISO 3200. For example, when the temperature at the time of shooting is 50° C. (the first threshold value or more, the first threshold value=40° C.) and the exposure period is 30 sec (the second threshold value or more, the second threshold value=8 sec), it is set to perform the signal read operation with the reference voltage VREF=V2. Further, for example, when the temperature at the time of shooting is 30° C. (the first threshold value is less than the first threshold value, the first threshold value=40° C.) and the exposure period is 30 sec (less than the second threshold value, the second threshold value=64 sec), it is set to perform the signal read operation with the reference voltage VREF=V1. It should be noted that in a case of increasing the imaging sensitivity, the output signal may be amplified by the analog amplifier 401 before AD conversion. In this case, since the dark current is also amplified, the first threshold value may be changed according to the exposure period and the imaging sensitivity, and the second threshold value may be changed according to the temperature at the time of shooting and the imaging sensitivity. Therefore, if a table as shown in FIG. 6 is provided for each imaging sensitivity, appropriate signal readout can be performed according to the amount of dark current. Then, by subtracting the dark current component from the read out pixel signal in the digital output processing circuit 210 or the like, an image signal can be obtained. With the image signal obtained in this manner, since low luminance output is A/D converted with high resolution, a high quality image can be obtained.

In FIG. 6, the set values of the reference voltage VREF are two types, namely, V1 and V2, but V3 having a larger amplitude than V2 may also be set. Further, in that case, a larger inclination may be set for the slope voltage VslopeL. Such setting of the slope voltage VslopeL is possible because, when the dark current such that the reference voltage VREF is set to be larger than V2 becomes large, the noise also increases accordingly, so even if the AD resolution is lowered, the influence on the image quality is small.

In this way, by appropriately switching the reference voltage VREF according to the amount of dark current at the time of shooting an image and shooting conditions, it is possible to perform high-speed reading when the amount of dark current is small as in short-time exposure, and it is possible to obtain a high quality image even under shooting conditions that cause a large amount of dark current.

Second Embodiment

Next, a second embodiment of the present invention will be described. In the second embodiment, setting of the reference voltage VREF is performed by evaluating the image quality at the time of shooting an image. Since the configuration of the image capturing apparatus and the method of driving the image sensor in the second embodiment are the same as those in the first embodiment, the description thereof will be omitted.

FIG. 7 is a diagram showing a configuration example of a pixel portion of the image sensor 103. The pixel portion of the image sensor 103 has an aperture pixel region 803 having aperture pixels, a first optical black region 801 and a second optical black region 802 which are reference pixel regions shielded from light by the light shielding member. The first optical black region (hereinafter referred to as a "first OB region") 801 is composed of pixels having no PD, and the second optical black region (hereinafter referred to as a "second OB region") 802 is composed of pixels having PDs. The pixel output of the second OB region 802 includes a dark current component and can be used for calculating the amount of dark current at the time of shooting an image. The output of the first OB region 801 having no PD does not have a dark current component and becomes a black reference level. Then, by subtracting the output of the first OB region 801 from the output of the second OB region 802, the dark current amount at the time of image sensing can be acquired. Note that the configuration of the pixel portion shown in FIG. 7 is an example, and the first OB region 801 and the second OB region 802 may be formed in the same row by separating regions.

A method (detection method) for calculating the amount of dark current in the case of using the image sensor 103 having the pixel portion as shown in FIG. 7 will be described. At the time of reading the pixel output after completion of shooting an image, the amount of dark current is measured using several lines of the second OB region 802. For example, in the upper several rows of the second OB region 802, AD conversion is performed by setting the reference voltage VREF=V1 with priority on the read time. Then, by calculating the average value of the output by the digital output processing circuit 210 and outputting the result to the TG 208, the value of the reference voltage VREF used for reading the rows including the aperture pixel region 803 is determined. As the reference voltage VREF, V2 is set when the calculated amount of dark current is equal to or larger than the predetermined threshold value, and V1 is set when the calculated amount of dark current is less than the predetermined threshold value. Since the amount of dark current generated in the image sensor differ by image sensor, the amount of dark current may not be accurately reflected in the switching control according to the photographing condition in some cases. However, by calculating the amount of dark current as in the present embodiment, it is possible to switch the AD conversion appropriately.

It should be noted that, upon driving the image sensor for calculating the amount of dark current, it is only necessary to know whether or not the amount of dark current is equal to or greater than a threshold. Therefore, the driving may be performed such that the reference voltage VREF is set to the threshold voltage, the judgment value J is obtained by driving in the mode 1 until the time t512, and the mode 1 and the mode 2 are switched in accordance with the result.

Third Embodiment

Next, a third embodiment of the present invention will be described. In the third embodiment, a method of performing reading at high speed when the absolute value of the reference voltage VREF is large will be described. Since the configuration of the image capturing apparatus and the method of driving the image sensor in the third embodiment are the same as those in the first embodiment, the description thereof will be omitted.

In the second embodiment, the method of calculating the amount of dark current using the second OB region 802 has been described. In the third embodiment, the slope voltage is inputted by shifting the starting voltage by the amount of the dark current when performing the AD conversion. Although the start voltage may be a voltage corresponding to the calculated amount of dark current, since the image signal includes a noise component other than the dark current, the start voltage may be set to a voltage slightly higher than the amount of dark current in consideration of other noise component. By shifting the start voltage in this way, the time required for the AD conversion can be shortened. As a result, the image sensor can be configured without increasing the bit width for the count value by a width corresponding to the dark current.

Figure 8:
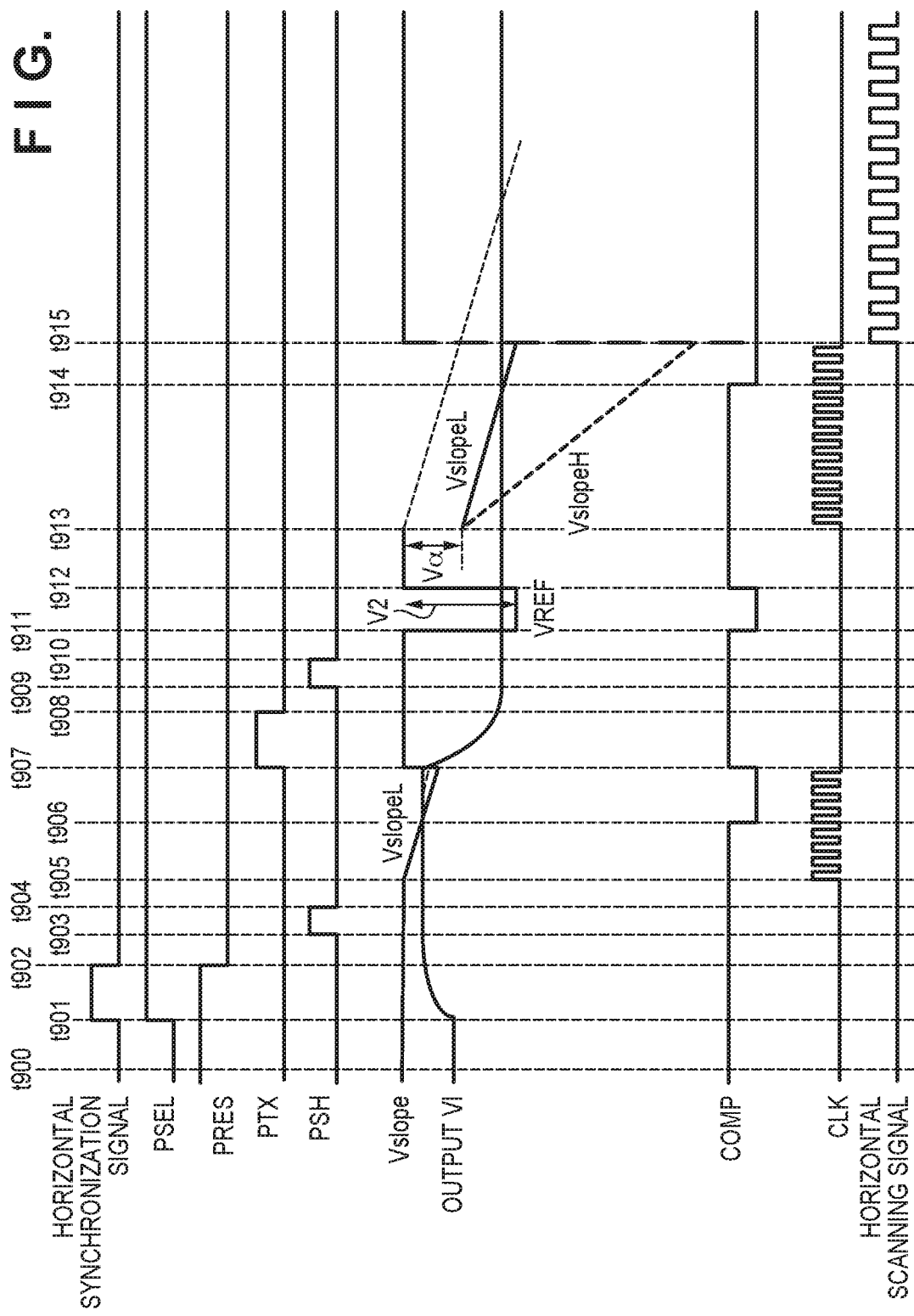
FIG. 8 is a timing chart showing an example of a signal readout operation of an image sensor under long-time exposure and high-temperature shooting conditions according to a third embodiment.

FIG. 8 is a timing chart showing an example of charge readout when the start voltage of the slope voltage is shifted. The signal reading operation of the third embodiment will be described with reference to FIG. 8. Since the operation from the time t900 to the time t912 is the same as the operation up to the time t612 in FIG. 5, the description thereof will be omitted.

From time t913 to t915, the slope voltage VslopeL (or VslopeH) is decreased from the voltage value Vα with the time by the slope voltage generation circuit 204. The voltage value Vα is determined in consideration of the amount of dark current calculated as a result of the dark current amount calculation driving. Which of the slope voltages VslopeH and VslopeL each column circuit 211 inputs to the comparator 405 is determined based on the value of the comparison output COMP of the comparator 405 between the time t911 and the time t912.

In the example shown in FIG. 8, when the level of the output voltage V1 is compared with the level of the reference voltage VREF (reference value), the output voltage V1≥the reference voltage VREF (V2), and a comparison output COMP becomes low level (=0). Therefore, a slope voltage VslopeL having a relatively gentle inclination is selected. Here, the value of the comparison output COMP from the time t911 to the time t912 is input to the selection circuit 404 as the judgment value J, and is also held in the judgment value memory 407.

At the same time as the slope voltage VslopeL starts to change, the clock CLK is supplied to the counter 406. The value of the counter 406 increases in accordance with the number of clocks CLK (number of clocks). When the slope voltage VslopeL input to the comparator 405 reaches the same level as the S signal, the comparison output COMP of the comparator 405 becomes low level (time t914), and at the same time, the operation of the counter 406 also stops. The count value when the operation of the counter 406 is stopped is the AD conversion value of the S signal and is held in the S memory 409 which is a memory for the S signal. As a comparison, the slope voltage when the start voltage is not shifted is indicated by a dotted line. It can be seen that the time when the S signal output V1 and the slope voltage VslopeL become the same level is faster when the start voltage is shifted by the voltage value Vα.

Subsequently, the signals held in the judgment value memory 407, N memory 408, and S memory 409 are read by the horizontal scanning circuit 205. By sequentially operating the column circuit 211 from the time t915, the signals held in the judgment value memory 407, N memory 408, and S memory 409 are sent to the digital output processing circuit 210 via the horizontal output lines 410, 411, and 412. Then, calculation processing such as calculation of a differential signal level (light component) obtained by subtracting the N signal from the S signal is performed, and then output to the outside of the image sensor 103. Incidentally, the count value corresponding to the shift of the start voltage of the slope voltage by the voltage value Vα may be added in the digital output processing circuit 210 and outputted.

Here, an example of a method of calculating the voltage value Vα will be described. With the image sensor 103 having the pixel portion as shown in FIG. 7, an average value OBave of output signals of several rows of the second OB region 802 is calculated in the digital output processing circuit 210. The result of this calculation is input to the selection circuit 404 of the column circuit 211. When the result is larger than the predetermined threshold value, the reference voltage VREF is set to, for example, V2, and AD conversion is performed. In addition, the digital output processing circuit 210 determines the voltage value Vα for shifting the start voltage of the slope voltage, and sends a signal to the slope voltage generation circuit 204. Although the voltage value Vα may be a voltage value corresponding to the value calculated from the output signal of the second OB region 802, it is preferable that the voltage value Vα is slightly shifted in consideration of the noise amount of the image signal. For example, an amount of variance OBσ of output signals of the second OB region 802 may also be calculated and the shift amount may be determined from OBave−3×OBσ, for example. Alternatively, a table of the starting voltage values Vα with respect to the values of OBave which is a digital output may be held, and the starting voltage value Vα may be determined from the table.

For the count value corresponding to the voltage value Vα, a table corresponding to voltage values and count values is prepared in advance, and the count value corresponding to the voltage value Vα is added to the pixel signal subjected to the AD conversion. Alternatively, prior to signal readout, the same voltage as the voltage value Vα may be input to the column output line 201, and AD conversion may be performed to obtain a count value corresponding to the voltage value Vα.

In this way, by changing the start voltage of the slope voltage according to the amount of dark current at the time of shooting an image, it is possible to obtain an image of high image quality while suppressing an increase in the reading time even under a shooting condition with a large amount of dark current.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-204569, filed on Oct. 18, 2016 which is hereby incorporated by reference herein in its entirety.

What is claimed is:

1. An image capturing apparatus comprising:
   a pixel portion that outputs a pixel signal;
   a comparator that compares a reference voltage or one of a plurality of comparison voltages having different slopes which change with time and the pixel signal,
   a selector that selects one of the plurality of comparison voltages according to a result of the comparison between the reference voltage and the pixel signal by the comparator;
   a counter that counts a number of clocks until a comparison result by the comparator indicates that the comparison voltage selected by the selector and a voltage of the pixel signal become equal since the selected comparison voltage starts changing; and
   a control circuit that controls the reference voltage to a higher level in a case where an exposure period is equal to or longer than a predetermined threshold than in a case where the exposure period is shorter than the threshold.

2. The image capturing apparatus according to claim 1, wherein the selector selects a first comparison voltage in a case where the pixel signal is smaller than the reference voltage, and selects a second comparison voltage whose slope is steeper than the first comparison voltage in a case where the pixel signal is equal to or greater than the reference voltage.

3. The image capturing apparatus according to claim 1, wherein the threshold is set according to the exposure period or imaging sensitivity.

4. The image capturing apparatus according to claim 1, wherein a plurality of pixels are arranged in matrix in the pixel portion, and the comparator and the counter are provided for each column.

5. An image capturing apparatus comprising:
   a pixel portion that outputs a pixel signal;
   a comparator that compares a reference voltage or one of a plurality of comparison voltages having different slopes which change with time and the pixel signal;

a selector that selects one of the plurality of comparison voltages according to a result of the comparison between the reference voltage and the pixel signal by the comparator;

a counter that counts a number of clocks until a comparison result by the comparator indicates that the comparison voltage selected by the selector and a voltage of the pixel signal become equal since the selected comparison voltage starts changing; and a control circuit that controls the reference voltage to a higher level in a case where temperature is equal to or greater than a predetermined threshold than in a case where the temperature is less than the threshold.

6. The image capturing apparatus according to claim 5, wherein the selector selects a first comparison voltage in a case where the pixel signal is smaller than the reference voltage, and selects a second comparison voltage whose slope is steeper than the first comparison voltage in a case where the pixel signal is equal to or greater than the reference voltage.

7. The image capturing apparatus according to claim 5, wherein the threshold is set according to the exposure period or imaging sensitivity.

8. The image capturing apparatus according to claim 5, wherein a plurality of pixels are arranged in matrix in the pixel portion, and the comparator and the counter are provided for each column.

9. An image capturing apparatus comprising:

a pixel portion that outputs a pixel signal;

a comparator that compares a reference voltage and the pixel signal;

a selector that selects resolution of AD conversion according to a result of the comparison between the reference voltage and the pixel signal by the comparator;

an AD converter that performs AD conversion on the pixel signal with the resolution selected by the selector; and a control circuit that controls the reference voltage to a higher level in a case where temperature is equal to or greater than a predetermined threshold than in a case where the temperature is less than the threshold.

10. The image capturing apparatus according to claim 9, wherein the threshold is set according to the exposure period or imaging sensitivity.

11. The image capturing apparatus according to claim 9, wherein a plurality of pixels are arranged in matrix in the pixel portion, and the comparator and the counter are provided for each column.

12. An image capturing apparatus comprising:

a pixel portion that outputs a pixel signal;

a comparator that compares a reference voltage and the pixel signal;

a selector that selects resolution of AD conversion according to a result of the comparison between the reference voltage and the pixel signal by the comparator;

an AD converter that performs AD conversion on the pixel signal with the resolution selected by the selector; and a control circuit that controls the reference voltage to a higher level in a case where an exposure period is equal to or longer than a predetermined threshold than in a case where the exposure period is shorter than the threshold.

13. The image capturing apparatus according to claim 12, wherein the threshold is set according to the exposure period or imaging sensitivity.

14. The image capturing apparatus according to claim 12, wherein a plurality of pixels are arranged in matrix in the pixel portion, and the comparator and the counter are provided for each column.

\* \* \* \* \*